United States Patent [19]

Robinson et al.

[11] Patent Number: 4,975,561

[45] Date of Patent: Dec. 4, 1990

[54] HEATING SYSTEM FOR SUBSTRATES

[75] Inventors: McDonald Robinson, Paradise Valley, Ariz.; Albert E. Ozias, Aumsville, Oreg.

[73] Assignee: Epsilon Technology Inc., Tempe, Ariz.

[21] Appl. No.: 319,260

[22] Filed: Mar. 3, 1989

Related U.S. Application Data

[62] Division of Ser. No. 63,409, Jun. 18, 1987, Pat. No. 4,836,138.

[51] Int. Cl.$^5$ .......................... F27B 5/14; F27D 11/00
[52] U.S. Cl. ...................................... 219/390; 219/405
[58] Field of Search ........................ 219/390, 405, 411; 118/727, 730, 50.1

[56] References Cited

U.S. PATENT DOCUMENTS

| | | | |
|---|---|---|---|
| 3,836,751 | 9/1974 | Anderson | 219/405 |
| 4,533,820 | 8/1985 | Shimizu | 219/390 |
| 4,535,228 | 8/1985 | Mimura | 219/411 |
| 4,545,327 | 10/1985 | Campbell | 118/725 |
| 4,654,509 | 3/1987 | Robinson | 219/411 |
| 4,680,451 | 7/1987 | Gat | 118/725 |

Primary Examiner—Teresa J. Walberg
Attorney, Agent, or Firm—Cahill, Sutton & Thomas

[57] ABSTRACT

A heating system for use in chemical vapor deposition equipment of the type wherein a reactant gas is directed in horizontal flow for depositing materials on a substrate which is supported in a reaction chamber on a susceptor which is rotatably driven for rotating the substrate about an axis which extends normally from its center. The heating system works in conjunction with a special heat sensing arrangement and includes an upper heating element assembly, a lower heating element assembly and a heat concentrator mechanism whic interact to provide rapid temperature build-up at the beginning of a processing cycle, rapid temperature attenuation at the end of a processing cycle and a controlled flat temperature profile during the processing cycle.

34 Claims, 4 Drawing Sheets

HEATING SYSTEM FOR SUBSTRATES

This is a division, of application Ser. No. 063,409, filed June 18, 1987 now U.S. Pat. No. 4,836,138.

BACKGROUND OF THE INVENTION

1. Field of the Invention

This invention relates to heating systems for use with a reaction chamber of chemical vapor deposition equipment and, more particularly, to a heating system for use with a horizontal gas flow reaction chamber having a rotatable susceptor for supporting a single substrate.

2. Discussion of the Related Art:

In the art of manufacturing semiconductor devices, it has long been a practice to employ chemical vapor deposition equipment for depositing various materials on substrates at high temperatures. Chemical vapor deposition equipment includes a reaction chamber configured to contain and control the flow of a reactant and carrier gas therethrough. A base, referred to as a susceptor, is located in the reaction chamber for supporting the substrates upon which the material is to be deposited; the reaction chamber, the susceptor and the substrate are heated to a desired reaction temperature.

A type of prior art structure discloses a slablike susceptor fixedly supported in a horizontal reaction chamber to support a multiplicity of substrates or wafers. A first radiant heat source is located above the reaction chamber and includes a plurality of elongated parallel radiant heating elements lying along horizontal axes above the reaction chamber A second radiant heat source is located below the reaction chamber and includes a plurality of elongated parallel radiant heating elements lying along horizontal axes transverse to the axis of the first radiant heat source. Thermal sensors are located in the susceptor to monitor the temperatures in various regions of the susceptor. The thermal sensors produce signals indicative of the temperatures sensed in their respective regions. Appropriate circuits and controls, responsive to the sensors, adjust the temperatures of the first and second radiant heat sources in the various regions to produce a substantially flat temperature profile in the susceptor.

While simultaneous deposition of materials on a multiplicity of substrates is desirable from a manufacturing standpoint, it has some drawbacks from a quality standpoint. The first problem associated with multi-substrate processing relates to the carrier gas which contains the atoms of the deposition materials. As the reactant gas flows over the surfaces of the substrate and the susceptor, deposition of the materials results in changes in the concentration of the deposition materials in the carrier gas. Consequently, as the reactant gas flows across the susceptor, any individual substrate and multiplicity of substrates, different rates of growth of the deposition of material may occur. A second problem is that of temperature control, which control is critical at the elevated temperatures needed for proper deposition. It is difficult, if not impossible, to control the temperature within the critical tolerances at all the desired locations within the relatively large reaction chambers. This results in different deposition layer thicknesses from one substrate to another and can even produce varying thickness of deposition between individual substrates. Still another problem is contamination which can result from various factors such as: the handling techniques used to load and unload the substrates; the reactant and carrier gases, and the reaction chamber itself. The reactant gas not only deposits the material on the substrate but also on the walls of the reaction chamber. In the relatively large reaction chambers required for multisubstrate processing, the unwanted wall deposits can be inadvertently incorporated into the layers being deposited on the substrates.

These problems and other factors all contribute to significant problems as the semiconductor devices produced from the substrates and the uses to which they are put become more sophisticated. Consequently, many changes and improvements have been made in the equipment that is used to process simultaneously a multiplicity of substrates. For example, some equipment manufacturers are now using automated loading and unloading devices to eliminate contamination resulting from human handling. However, there are practical limits which many feel will ultimately make the simultaneous multisubstrate processing techniques unacceptable. One of the limitations is that of adapting the equipment to handle larger diameter substrates. The economics attendant large diameter substrates are beneficial. Increasing the size of the substrate results in problems with regard to temperature differentials across the substrate, decreasing concentrations of the deposition materials across the substrate and the like. Therefore, steps have been taken by some equipment manufacturers to make single substrate processing equipment significantly simpler in controlling the various factors involved in chemical vapor deposition. Single substrate processing is more desirable than multisubstrate equipment for large substrates, i.e. six to eight inches and more in diameter. One important consideration is the cost at risk when processing one instead of several substrates; that is, if something goes wrong, the monetary loss is far less with one substrate than it is with a plurality of substrates.

SUMMARY OF THE INVENTION

The chemical vapor deposition system includes a horizontal flow reaction chamber having a bottom surface with a tubular shaft depending therefrom. A circular susceptor for supporting a single substrate is disposed within the reaction chamber on a driveshaft assembly which axially depends from the susceptor through the tubular shaft. The driveshaft assembly is rotatably drivable to rotate the susceptor and the supported substrate. The critical temperatures at various points of the susceptor are sensed by a master temperature sensor extending axially through the driveshaft assembly into the vicinity of the center of the susceptor. A special non rotatable ring is located in the reaction chamber in concentric relationship with the susceptor. At least one and preferably three or more slave temperature sensors are located in the fixed ring for sensing the temperatures at various points near the periphery of the susceptor. The master temperature sensor and the slave temperature sensors produce signals indicative of the temperatures sensed. These signals are transmitted to a control means which compares them to a predetermined set point temperature and generates signals coupled to a special heating system for controlling its operation.

The heating system includes an upper heating element assembly disposed above the reaction chamber, a lower heating element assembly located below the reaction chamber and a heat concentrator means. The upper heating element assembly includes a housing having a plurality of elongated tube type radiant heating elements which lie on horizontal axes in alignment with the direction of the reactant gas flow through the reaction chamber. The housing includes a combination of planar and curved reflective surfaces to provide a particular heat radiation pattern ideally suited for the susceptor and the fixed ring temperature sensor. The lower heating element assembly includes a housing having a plurality of elongated tube type radiant heating elements which lie along horizontal axes aligned transverse to the direction of the reactant gas flow though the reaction chamber. The housing includes a combination of planar and curved reflective surfaces to provide a heat radiation pattern ideally suited for the susceptor and the fixed ring temperature sensor.

A radiant heat concentrator means is mounted on the housing of the lower heating element assembly proximate the central opening thereof for directing concentrated radiant heat toward the center of the susceptor to compensate for heat losses due to the depending tubular shaft. In addition, the radiant heat concentrator means in combination with selected heat input zones of the upper and lower heating element assemblies provides a temperature controlling capability to allow a rapid build-up in the temperature of the susceptor at the beginning of a deposition cycle and a rapid temperature attenuation at the end of a deposition cycle. The master temperature sensor produces signals indicative of the changes in temperature and the control circuitry means reacts to those signals by appropriately changing the radiant heat output of the other heat input zones of the upper and lower heating element assemblies. The slave temperature sensors react to the temperature changes resulting from the changes in the heat output of the other heat input zones of upper and lower heating element assemblies by producing signals which are fed back to the control circuitry means which controls those other heat input zones of the upper and lower heating elements to provide a balancing effect to obtain a uniform temperature profile in the substrate or wafer.

Accordingly, it is an object of the present invention to provide a heating system for the reaction chamber of chemical vapor deposition equipment.

Another object of the present invention is to provide a heating system for use in a horizontal flow reaction chamber having a rotatably driven circular susceptor mounted therein with a master temperature sensor proximate the center of the susceptor and slave temperature sensors mounted at various points about the susceptor in a non rotating ring concentric with the susceptor.

Another object of the present invention is to provide a heating system for a reaction chamber having an upper heating element assembly located above the reaction chamber, a lower heating element assembly below the reaction chamber and a heat concentrator means for directing concentrated heat at the center of a rotatable susceptor.

Another object of the present invention is to provide a heating system for a reaction chamber having an upper heating element assembly of a plurality of elongated tube type radiant heating elements disposed along axes parallel with the flow of reactant gas through the reaction chamber and interacting with a special configuration of planar and curved reflective surfaces to provide a heat radiation pattern ideally suited for a rotatable circular susceptor.

Another object of the present invention is to provide a heating system for a reaction chamber having a lower heating element assembly of a plurality of elongated tube type radiant heating elements disposed along axes transverse to the flow of reactant gas through the reaction chamber and interacting with a special configuration of planar and curved reflective surfaces to provide a heat radiation pattern ideally suited for a rotatable susceptor.

Another object of the present invention is to provide upper and lower heating element assemblies and a concentrator means interacting with master and slave temperature sensors and a control circuit means for producing a flat temperature profile for a substrate supported on a susceptor in a reaction chamber.

The foregoing and other objects of the present invention will be more fully understood from the following description in conjunction with the accompanying drawings.

DESCRIPTION OF THE PREFERRED EMBODIMENT

Figure 1:
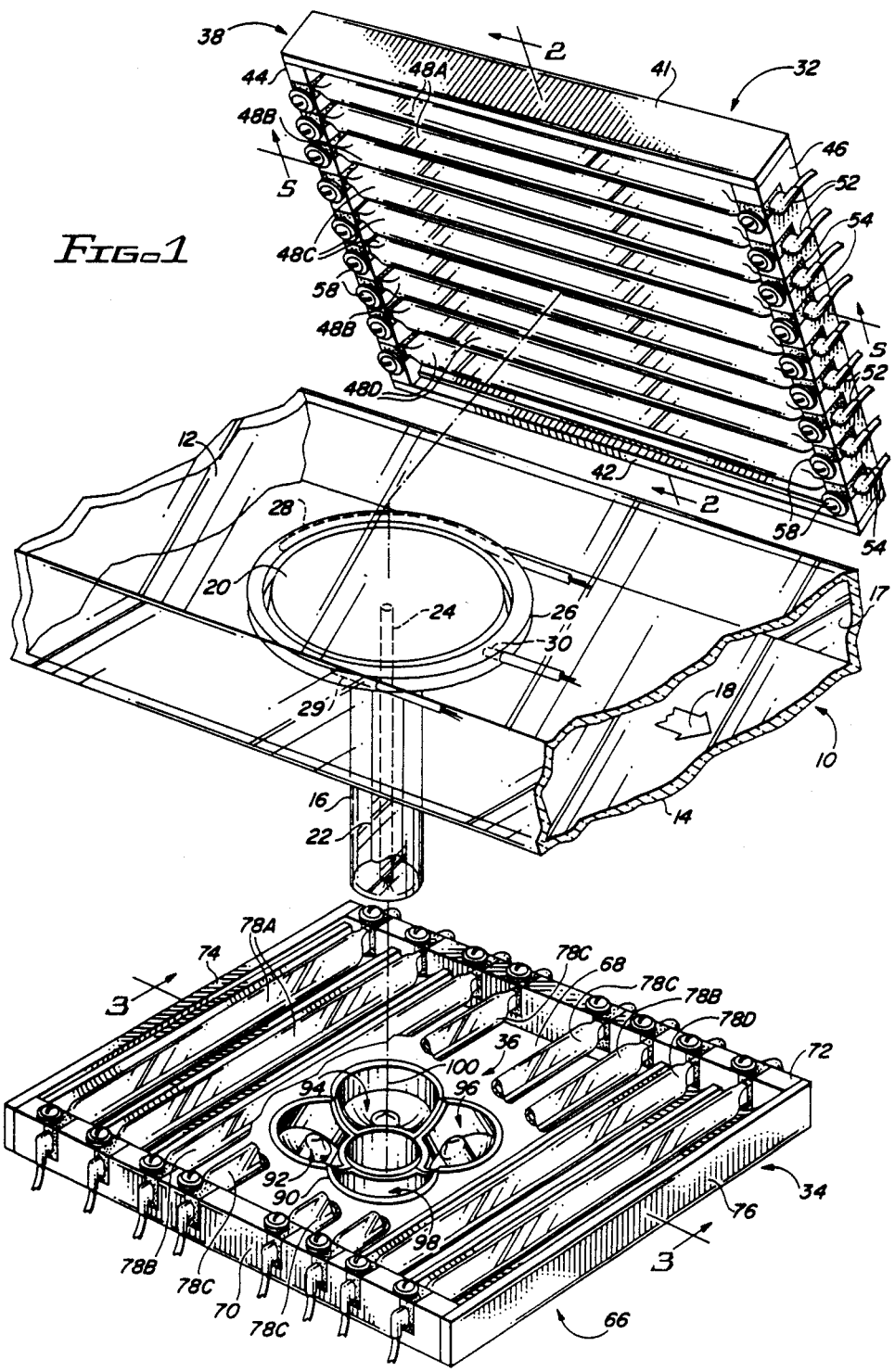
FIG. 1 is a perspective view of a heating system shown in exploded relationship with a specialized reaction chamber, a rotatable circular susceptor and a temperature sensing arrangement for a chemical vapor deposition system.

The system illustrated in FIG. 1 includes a reaction chamber 10 of the horizontal flow type formed of a material transparent to radiant heat energy, such as fused quartz. The reaction chamber includes a planar top wall 12, a planar bottom wall 14 with a tubular shaft 16 depending therefrom and the chamber defines a gas flow passage 17. A reactant gas flows within reaction chamber 10 in a direction indicated by the arrow 18 to deposit materials on a substrate 19 (FIGS. 2 and 3) placed in the reaction chamber at the beginning of a deposition cycle and removed therefrom after the cycle is completed.

The substrate is supported on susceptor 20. The susceptor is circular and is supported on and rotatably driven by a driveshaft assembly 22 extending downwardly from reaction chamber 10 and coaxially through tubular shaft 16. Temperature sensors include a master temperature sensor 24 extending axially upwardly through the driveshaft assembly for sensing the temperature at the center of the susceptor to produce signals indicative of the temperature sensed. A fixed, non rotating ring 26 is supported in reaction chamber 10 in concentric relationship with the susceptor. The fixed ring contains a plurality of slave temperature sensors 28, 29 and 30. The slave temperature sensors sense the temperatures at various points about the periphery of the susceptor and produce signals indicative of the temperatures sensed.

The heating system includes an upper heating element assembly 32, a lower heating element assembly 34 and a heat concentrator means 36. The upper heating element assembly includes a generally rectangular housing 38 having a planar top wall 40, a spaced apart pair of sidewalls 41 and 42 and a spaced apart pair of endwalls 44 and 46 which cooperatively define a downwardly opening chamber. A plurality of elongated tube type radiant heating elements 48A, 48B, 48C and 48D are mounted in the downwardly opening chamber and disposed in spaced apart parallel relationship and lie on an axes substantially parallel with the reactant gas flow path through reaction chamber 10. Each of the elongated tube type heating elements is preferably a high intensity tungsten filament lamp having a transparent quartz envelope containing a halogen gas, such as iodine. Elongated tube type heating elements, hereinafter referred to as lamps, 48A, 48B, 48C and 48D produce radiant heat energy of short wavelength (preferably on the order of one micron) transmitted through the reaction chamber walls without appreciable absorption.

Figure 5:
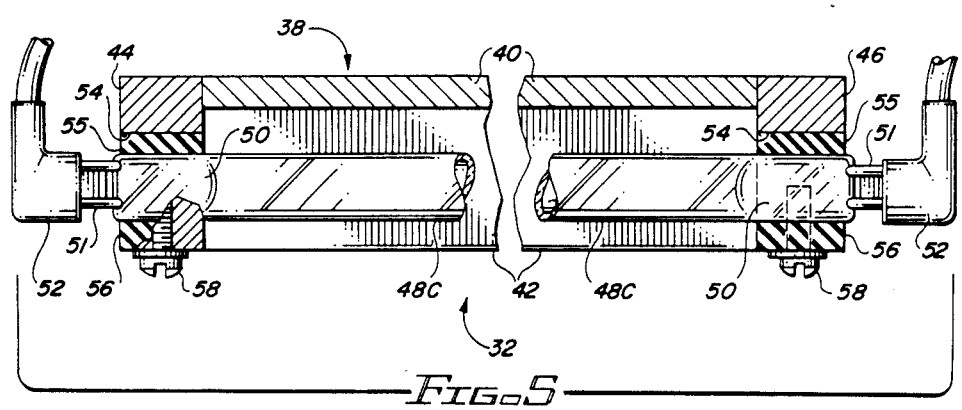
FIG. 5 is an enlarged fragmentary sectional view taken along lines 5—5 of FIG. 1.

Although lamps 48A, 48B, 48C and 48D (hereinafter referred to as lamps) may be of different wattages, they are of similar configuration. The following description of one of lamps 48C and its mounting will be understood to apply to the other lamps as well. As shown best in FIG. 5, the lamp has an integrally formed axially extending lug 50 on each of its opposite ends and a suitable connection pin arrangement 51 extends from each of the lugs for receiving connectors 52 provided at the ends of electrical conductors. Endwalls 44 and 46 of housing 38 are formed with downwardly opening slots 54 through which lugs 50 extent and shock pads 55 and 56 are mounted in the slots above and below the lugs. The lugs and the shock pads are demountably retained in their respective slots 54 by fastener means 58 (such as the illustrated offset screw washer device).

Figure 2:
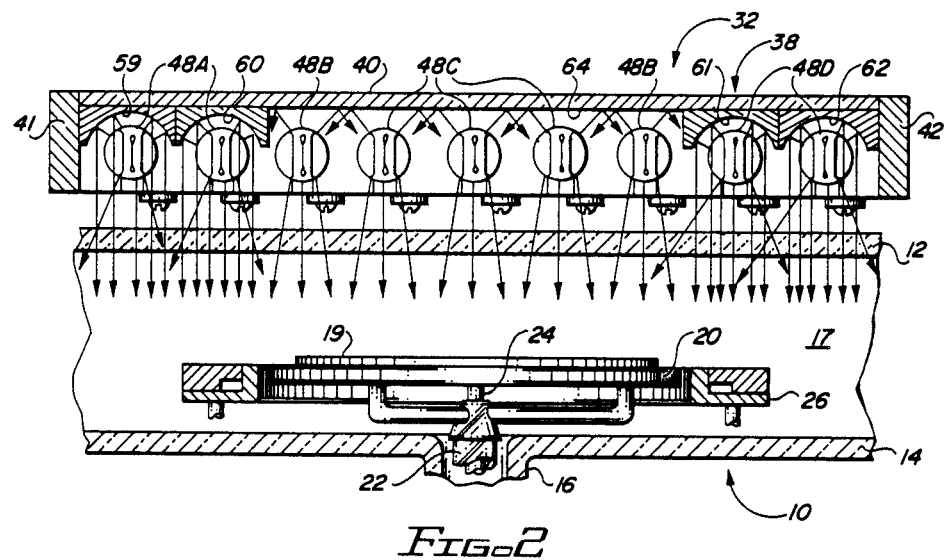
FIG. 2 is an enlarged sectional view taken along lines 2—2 of FIG. 1 and shows the various features of the upper heating element assembly and its relationship to a reaction chamber, a rotatable circular susceptor and a temperature sensing arrangement of a deposition system.

As shown in FIG. 2, elongated linear concave reflective surfaces 59 and 60, which may be parabolic or elliptical segments in cross section, are provided above lamps 48A and proximate sidewall 41. Two similar elongated linear concave reflective surfaces 61 and 62 re provided above lamps 48D and proximate sidewall 42. Reflective surfaces 59, 60, 61 and 62 may be formed integral with top wall 40 or may be formed as separate elements which are welded or otherwise mounted in housing 38. Lamps 48A are located at the focal point of their respective reflective surfaces 59 and 60 so that the radiated heat energy will be reflected along parallel paths, as indicated by the arrows. Similarly, lamps 48D are located at the focal points of their respective reflective surfaces 61 and 62 to produce parallel reflected radiant hat energy, as indicated. The reflected radiant heat energy is directed to the vicinity of fixed ring 26 and concentrates radiated heat energy in the vicinity of diametrically opposed lateral edges of susceptor 20 to compensate for heat losses which inherently occur there and at the peripheries of the susceptor and the supported substrate.

The exposed planar portion of inner surface 64 of top wall 40 is highly reflective (polished, plated or the like) so that both direct and reflected radiant heat energy from lamps 48B and 48C will be directed through top wall 12 of reaction chamber 10 and impinge on the upper surface of fixed ring 26, susceptor 20 and on supported substrate 19. The radiant energy which is directed onto the substrate will be of a more diffuse nature than the concentrated energy directed onto the fixed ring.

Lower heating element assembly 34 is similar to upper heating element assembly 32 and includes a generally rectangular housing 66 having a planar bottom wall 68, a spaced apart pair of sidewalls 70 and 72 and a spaced apart pair of endwalls 74 and 76 which cooperatively define an upwardly opening chamber. A plurality of elongated tube type radiant heating elements or lamps 78A, 78B, 78C and 78D are mounted in the upwardly opening chamber of housing 66 in spaced apart parallel relationship with respect to each other and on an axes transverse to the reactant gas flow path through reaction chamber 10; they are also transverse to lamps 48A-48D of the upper heating element assembly.

Each of lamps 78A, 78B, 78C and 78D may be identical with lamps 48A-48D. Further, lamps 78A-78D may be mounted in housing 66 in the manner hereinbefore described with reference to lamps 48A-48D.

Figure 3:
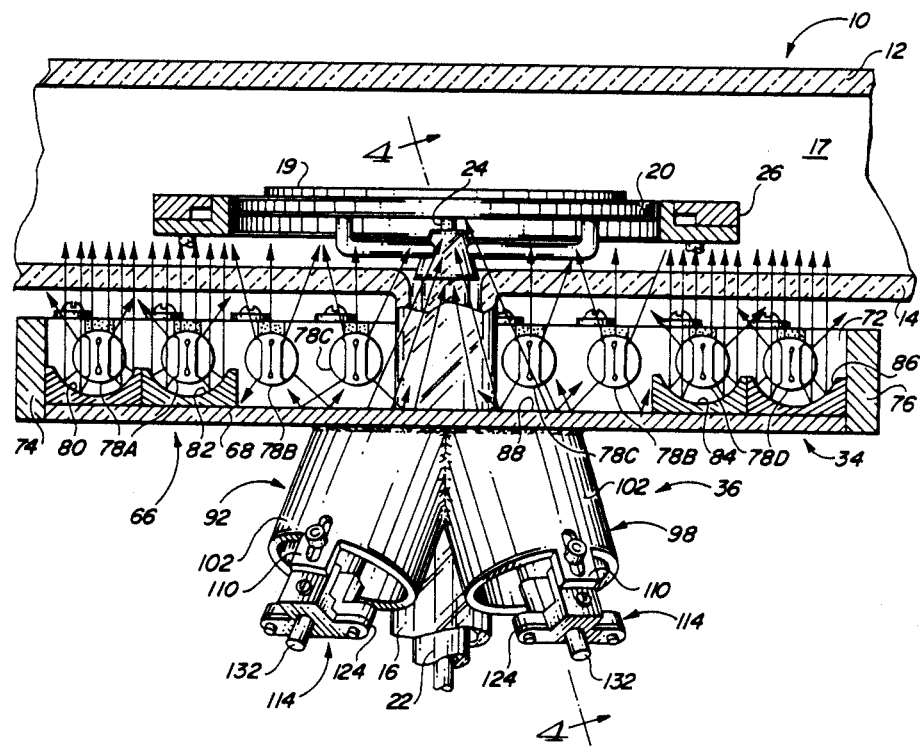
FIG. 3 is an enlarged sectional view taken along lines 3—3 of FIG. 1 and shows the various features of the lower heater element assembly and the heat concentrator means and their relationship to a reaction chamber, a rotatable circular susceptor and a temperature sensing arrangement of a deposition system.

As shown in FIG. 3, elongated linear concave reflective surfaces 80 and 82, which may be parabolic or elliptical segments in cross section, are provided immediately below two lamps 78A proximate endwall 74 of housing 66. Two reflective surfaces 84 and 86 are located below two lamps 78D proximate sidewall 76 of the housing. Reflective concave surfaces 80, 82, 84 and 86 may be formed integrally in bottom wall 68 or may be formed as separate elements and mounted in the housing, as shown. Reflective concave surfaces 80, 82, 84 and 86 cooperate with their respective lamps 78A and 78D, located at the focal points of the reflective surfaces, to produce parallel rays of radiant heat energy into the vicinity of and onto fixed ring 26; this radiant energy cooperates with the directly radiated heat energy to concentrate the radiated heat energy at the diametrically opposed peripheral edges of susceptor 20 at the upstream, or leading, edge of the susceptor and at the downstream, or trailing edge, of the susceptor.

The exposed planar portion of inner surface 88 of bottom wall 68 is highly reflective and both direct and reflected radiant heat energy from heat lamps 78B and 78C is directed through bottom wall 14 of reaction chamber 10 to heat fixed ring 26 and susceptor 20. Accordingly, the radiant energy directed onto the lower surface of the susceptor will be diffused.

Radiant heat energy from the upper heating element assembly 32 will heat fixed ring 26, susceptor 20 and substrate 19 from the top and the lower heating element assembly 34 will do the same from the bottom. Furthermore, by virtue of elongated concave reflective surfaces 59, 60, 61 and 62 of heating element assembly 32, concentrated heating zones or regions are provided in the vicinity of the diametrically opposed side edges, i.e. those adjacent the sidewalls of the reaction chamber. Similarly, by virtue of elongated concave reflective surfaces 80, 82, 84 and 86 of lower heating element assembly 34, transverse concentrated heating zones or regions are provided in the vicinity of the diametrically opposed front and back edges.

Bottom wall 68 of housing 66 is provided with a central opening 90 through which depending tubular shaft 16 and the susceptor supporting driveshaft assembly 22 extend. Due to the depending tubular shaft and the driveshaft assembly, there will be some inherent heat losses at the center of susceptor 20. To compensate for this heat loss and to provide temperature control, radiant heat concentrator means 36 is provided. The radiant heat concentrator means preferably includes four identical heat focusing devices 92, 94, 96 and 98 which are located in equally spaced apart relationship about vertical axis 100 (FIG. 4) defined by central opening 90. Each of the heat focusing devices is attached to the bottom wall of lower housing 66.

Figure 4:
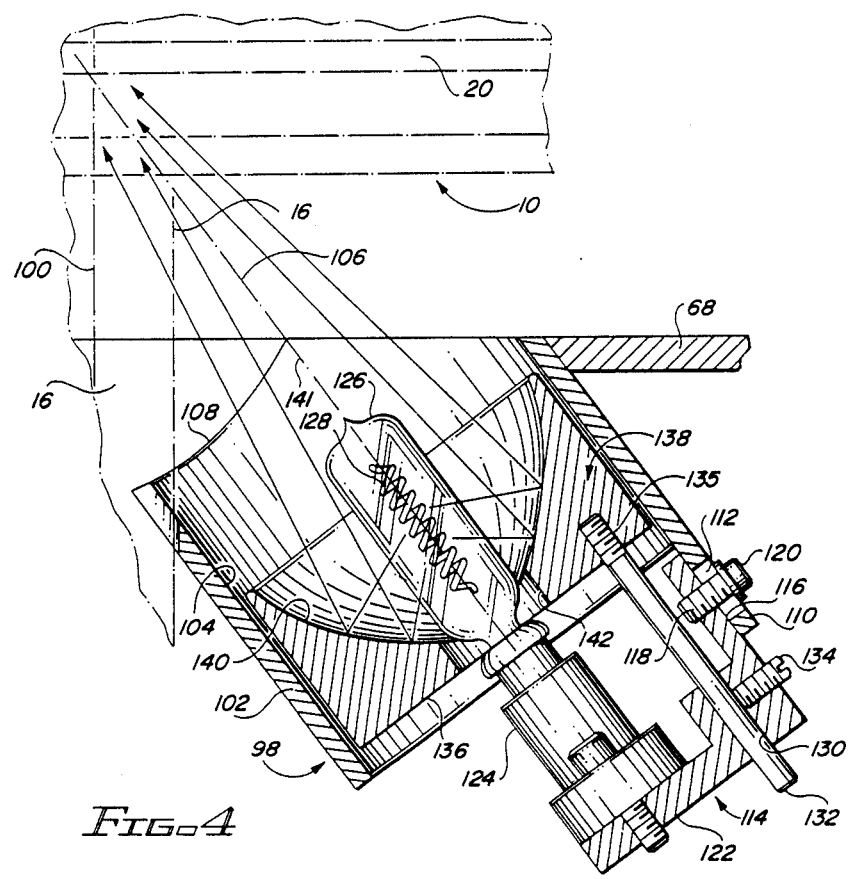
FIG. 4 is an enlarged fragmentary sectional view taken along lines 4—4 of FIG. 3.

As shown in FIG. 4, radiant heat focusing device 98 (as well as 92, 94, 96) includes a cylindrical body 102 defining an open ended axial bore 104. The body is disposed so that axis 106 of the body forms an angle with respect to vertical axis 100 on the order of about 35°. Top end 108 of body 102 is of irregular configuration to fit into the irregular opening 90 of housing 66, to provide a noninterfering fit with the similar bodies of adjacent heating devices 92, 96 and to provide clearance for depending tubular shaft 16 of the reaction chamber. The lower end of body 102 has an extending tail portion 110 with an elongated opening 112. An L-shaped bracket 114 is provided with a first flange 116 having an internally threaded opening 118 for threadingly receiving a fastener bolt 120 to secure the L-shaped bracket to the tail portion of the body. By virtue of elongated opening, the entire L-shaped bracket can be adjustably moved axially toward and away from body 102. L-shaped bracket 114 includes a second flange or base 122 which lies in a plane transverse to axis 106. A lamp socket 124 is mounted on flange 122 to extend normally therefrom toward axial bore 104 of body 102. A bulb type radiant heating element, such as a lamp, 126 is mounted in socket 124 and extends axially upwardly into bore 104. The lamp is preferably a high intensity bulb having a tungsten filament 128 in a transparent quartz envelope filled with a suitable halogen gas.

L-shaped bracket 114 is also provided with a bore 130 parallel to but laterally offset from axis 106 of body 102. A rod 132 is axially slidable in bore 130 and a set screw 134 is employed to releasably hold the rod in position. The rod has a threaded upper end 135 mounted in a threaded bore formed in base 136 of a dish shaped reflector 138. The reflector is cylindrical and has a concave reflective surface 140 and a reflector axis 141 normal to base 136 and coincident with axis 106 of the body. The concave reflective surface may be parabolic or elliptical. An opening 142 extends axially from base 136 of the reflective surface and lamp 126 extends axially through opening 142 up into the area defined by concave reflective surface 140.

Lamp 126 is located to position its filament along the reflector axis proximate the focal point of reflector 138 so that the radiant heat energy impinging on the concave reflective surface will be convergingly reflected. As the focal point of reflector 138 is a point and as the filament of the lamp is linear, the entire source of radiant heat energy cannot physically lie on the focal point. Therefore, the convergingly reflected heat energy will not converge at a single point but will instead converge in an area which is a fuzzy concentration of radiated heat energy. As a result of such fuzzy concentration of radiated heat energy from each of focusing devices 92, 94 and 98, an area in and around the center of the susceptor 20 is the recipient of the concentrated heat energy; the radiation concentration can be adjustably varied due to the axially adjustable capabilities of the reflector and lamp 126.

Figure 6:
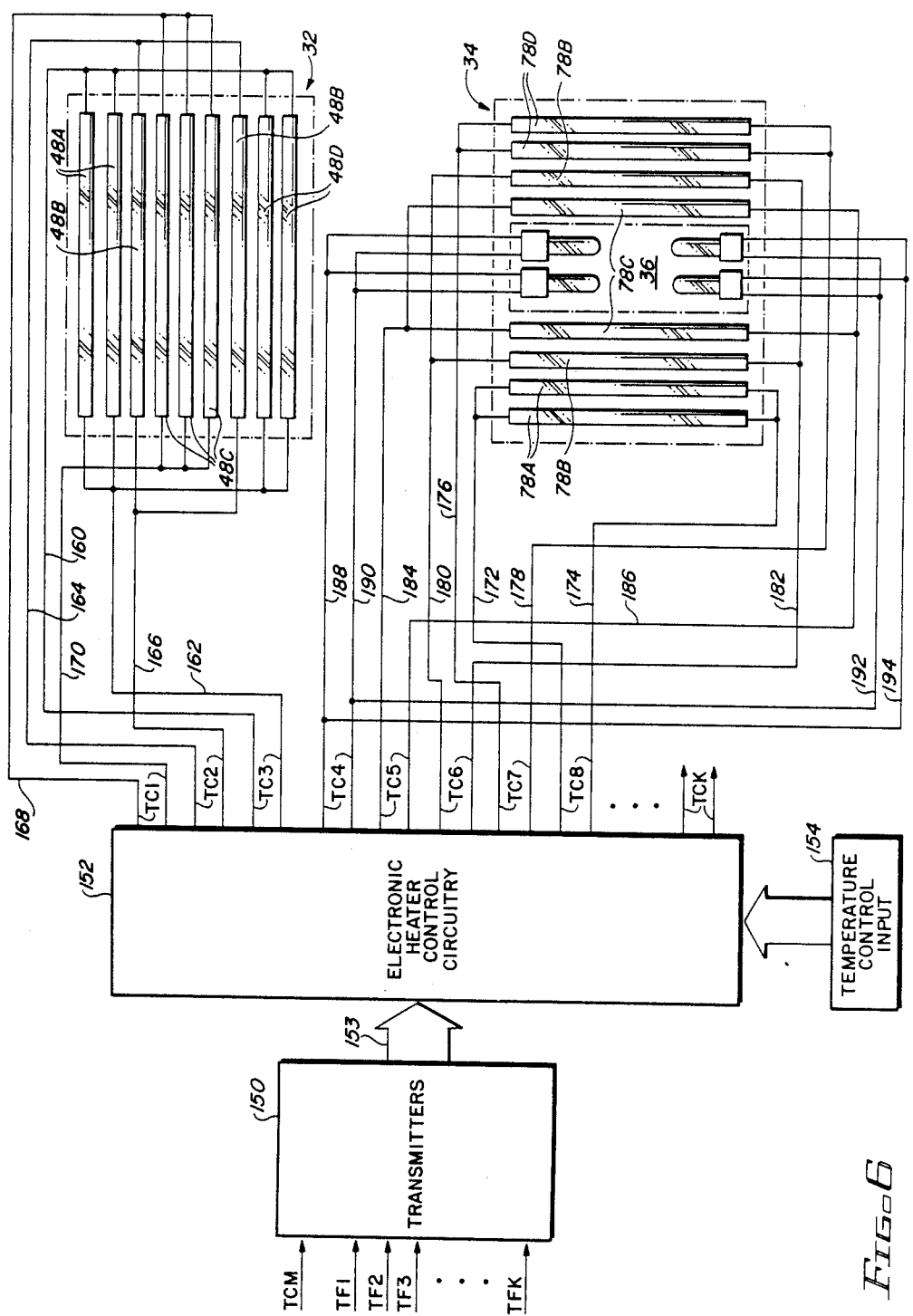
FIG. 6 is a diagrammatic view of the heating system of the present invention and also shows an electrical schematic.

Reference is now made to FIG. 6 wherein a schematic diagram to illustrate a preferred manner of operation and control of the heating system of the present invention. Master heat sensor 24 and the temperature follower, or slave, heat sensors 28, 29 and 30, sense the temperatures at various zones in and around susceptor 20 and fixed ring 26 and produce signals indicative of the temperatures senses. The signals from the master temperature sensor are directed to transmitter circuitry 150, as indicated at TCM. Similarly, signals from temperature sensors 28, 29 and 30, which may vary in number as needed, are supplied as inputs TF1, TF2, TF3 . . . TFK, to transmitter circuitry 150. The transmitter circuitry contains well known components and circuits for transmitting the temperature indicative signals to an electronic heater control 152, as indicated by the data transfer arrow 153. Electronic heating control 152 may include any conventional type of master-slave heater control circuitry which would typically include a power supply, a plurality of lamp driver circuits and a plurality of differential amplifiers with selectively alterable offset controls.

Temperature control information, such as data indicating the start and finish of a vapor deposition cycle, the desired operating temperature at which the deposition is to be accomplished, and the like, may be supplied to the electronic heating control 152 from a temperature control means 154. The electronic heater control also receives data from temperature sensors 24, 28, 29 and 30. With this data, it generates a plurality of control signals to add or subtract power from upper and lower heating element assemblies 32 and 34 and concentrator means 36 for precise control of the heating of the susceptor. As the temperature sensors sense temperatures in various zones in reaction chamber 10, the radiant heat input of upper and lower heating element assemblies and the heat concentrator means can be operated in a manner to individually control zones of radiant heating energy.

As shown in FIG. 6, the four lamps (48A and 48D) of upper heating element assembly 32 have their opposite end terminals connected together by conductors 160 and 162 to operate as an entity through control signals TC-3 from heater control 152. Thus, the four lamps provide two physically spaced apart commonly controlled heating zones proximate the opposite sidewalls of the reaction chamber; and the zones extend parallel with the reactant gas flow path and heat the opposed lateral edges of fixed ring 26 and susceptor 20. Two lamps 48B have their opposite end terminals connected together by conductors 164 and 166 and are controlled as an entity through control signals TC-2 from heater control 152. These two lamps provide two more physically separated heating zones which are controlled as a single entity; these zones extend parallel with the reactant gas flow path between the zones established by lamps 48A and 48D. Three lamps 48C have their opposite end terminals connected by conductors 168 and 170 to operate as an entity through control signals TC-1. These centrally located lamps provide a single central zone of radiant heating energy which extends across fixed ring 26 and susceptor 20 parallel with the reactant gas flow path through the reaction chamber.

Lower heating element assembly 34 has the end terminals of two lamps 78A connected together by conductors 172 and 174 to operate as a single entity through control signals TC-7. These two lamps provide a single individually controllable zone of radiant heat energy extending transversely of the reaction chamber below the leading edges of fixed ring 26 and susceptor 20. Similarly, two lamps 78D have their end terminals connected together by conductors 176 and 178 to operate as an entity through control signals TC-7. These two lamps provide a single individually controllable zone of radiant heat energy extending transversely across the reaction chamber below the trailing edges of fixed ring 26 and susceptor 20. Two lamps 78B of lower heating element assembly 34 have their end terminals connected together by conductors 180 and 182 to operate as an entity by through control signals TC-6. These two lamps provide two spaced apart transversely extending zones of radiant heat energy controlled in unison; one of these zones is adjacent and immediately downstream of the leading edges of the fixed ring and the susceptor and the other zone is immediately upstream of trailing edges thereof. Similarly, two lamps 78C have their end terminals connected together by conductors 184 and 186 to operate as a single entity through control signals TC-5. These two lamps provide two physically spaced apart transversely extending heating zones disposed on opposite sides of the center of susceptor 20. Lamps 126 of heat concentrator means 36 have their respective terminals connected by conductors 188, 190, 192 and 194 Connected to receive control signals TC-4. Thus, each of the radiant heat focusing devices operate in unison to provide a concentrated radiant energy heat zone at the center area of the susceptor.

Preferred Operation

When an input signal is received from temperature control input means 154 to indicate the start of a deposition cycle, heater control means 152 responds by applying full power to: radiant heat focusing devices 92, 94, 96 and 98 of the heat concentrator means 36; lamps 48B, 48C of upper heating assembly 32; and, lamps 78B, 78C of lower heating assembly 34. The same input signal contains information indicative of a desired operating temperature at which the deposition cycle is to be accomplished. The application of full power to heat concentrator means 36 and to the selected heating elements of heating assemblies 32 and 34 produces a rapid rise in the temperature in the central area of susceptor 20 and in the central area of substrate 19 being processed Master temperature sensor 24 senses the rapid rise in temperature and sends signals indicative thereof to heater control means 152 which compares the sensed temperature with the desired operating temperature and adjusts the power supplied to concentrator means 36 and the selected lamps of upper and lower radiant heating assemblies 32 and 34 to produce and maintain the desired operating temperature in the central area of the susceptor and the substrate.

The sensed temperature signals produced by the master temperature sensor are also used simultaneously by heater control means 152 to apply power to lamps 48A, 48D, 78A and 78D of upper and lower heating element assemblies 32 and 34, respectively. Thus, while the temperature in the central areas of the susceptor and the substrate are being brought up to the desired operating temperature, the temperature's about the periphery of the susceptor an in fixed ring 26 are simultaneously being brought up to temperature by lamps 48A, 48D, 78A and 78D. The increasing temperatures in the peripherally located heating zones are sensed by slave temperature sensors 28, 29 and 30 and additional sensors, if desired The signals received by heater control means 152 from slave temperature sensors 28, 29 and 30 are compared with the signal received from the master temperature sensor to adjust the power to lamps 48A, 48D, 78A and 78D to bring the temperatures in the peripherally located heating zones into alignment with the temperature in the central area of susceptor 20 and substrate 19.

Due to variables such as heat losses at the peripheral edges of substrate 19 and susceptor 20, the flow of reactant gas through reaction chamber 10 and the like, lamps 48A, 48D, 78A and 78D may be ideally set to normally operated at temperatures which are offset, i.e., different than the desired operating temperature in the central area of the substrate and the susceptor. The process of sensing temperatures and adjusting the power applied to the various groups or banks of heating elements as needed is continued throughout the deposition cycle. The object is to provide a uniform or flat temperature gradient in all of the relevant areas of the substrate, the susceptor and the fixed ring during the deposition cycles. In the interests of production time, it is preferable to bring the system up to temperature as fast as possible at the beginning of a cycle and to cool it down when a cycle is completed. The rapid increase in temperature at the beginning of a cycle is accomplished by heat concentrator means 36 and selected heating elements of upper and lower heating assemblies 32 and 34 in combination with the master-slave temperature sensor arrangement which effectively produces a temperature following mode of operation. Cooling the system down at the end of a cycle is accomplished by reversing the above heating procedure. In other words, the power applied to concentrator means 36 and the selected heating elements proximate the center of upper and lower heating assemblies 32 and 34 is reduced and the temperature in the peripherally located heating zones will follow along with the reduction of heat at the center areas of the substrate and the susceptor.

While the principles of the invention have now been made clear in an illustrative embodiment, there will be immediately obvious to those skilled in the art many modifications of structure, arrangement, proportions, elements, materials and components used in the practice of the invention which are particularly adapted for specific environments and operating requirements without departing from those principles.

What we claim is:

1. Heating apparatus for heating substrates during a chemical vapor deposition process, said apparatus comprising in combination:
   (a) a reaction chamber formed of a material transparent to heat energy of a predetermined wavelength, said reaction chamber having a top wall, spaced apart sidewalls, a bottom wall for cooperatively defining a horizontal reactant gas flow path through said reaction chamber and a tubular shaft depending from the bottom wall;
   (b) a rotatable susceptor disposed in said reaction chamber for supporting a single substrate and for rotating the substrate about an axis extending normally from the center of the substrate;
   (c) means extending upwardly through the depending tubular shaft for supporting and rotating said susceptor;
   (d) a fixed ring concentrically disposed relative to said susceptor in said reaction chamber;

(e) a master temperature sensor disposed at the center of said susceptor for producing signals indicative of the temperature sensed at the center of said susceptor;

(f) a plurality of slave temperature sensors disposed in said fixed ring for sensing the temperatures at various points about the periphery of said susceptor;

(g) an upper heating element means in upwardly spaced overlaying relationship with the top wall of said reaction chamber for directing heat energy downwardly onto said susceptor and the substrate supported thereon and onto said fixed ring;

(h) a lower heating element means in downwardly spaced underlying relationship with said reaction chamber for directing heat energy upwardly onto said susceptor and said fixed ring, said lower heating element means defining an opening through which the depending tubular shaft extends; and (h) heat concentrator means for directing concentrated heat energy upwardly to the area at the center of said susceptor.

2. A heating apparatus as claimed in claim 1 wherein said upper heating element means includes a plurality of spacedly arranged elongated radiant heating elements.

3. A heating apparatus as claimed in claim 2 wherein each elongated radiant heating element of said plurality of elongated radiant heating elements is disposed on an axis parallel with the reactant gas flow path through said reaction chamber.

4. A heating apparatus as claimed in claim 3 comprising means for electrically interconnecting said plurality of elongated radiant heating elements to provide at least first and second independently controllable banks of said elongated radiant heating elements, said first bank of elongated radiant heating elements comprising central ones of said plurality of elongated radiant heating elements and said second bank of elongated radiant heating elements being disposed laterally on opposed sides of said first bank of elongated radiant heating elements.

5. A heating apparatus as claimed in claim 4 comprising:

(a) first elongated concave reflector means disposed proximate one portion of said bank of elongated radiant heating elements disposed on one side of said first bank of elongated radiant heating elements for reflectively directing concentrated radiant heat energy into said reaction chamber and in a zone proximate one of the sidewalls;

(b) second elongated concave reflector means disposed proximate an other portion of said second bank of elongated radiant heating elements disposed on the other side of said first bank of elongated radiant heating elements for reflectively directing concentrated radiant heat energy into said reaction chamber and in a zone proximate the other of the sidewalls; and (c) planar reflector means proximate said first bank of elongated radiant heating elements for reflectively directing radiant heat energy into said reaction chamber in a zone central to said reaction chamber.

6. A heating apparatus as claimed in claim 1 wherein said upper heating element means comprises:

(a) a housing having a top wall and defining a downwardly opening chamber;

(b) a plurality of radiant heating elements mounted in spaced side by side positions in said housing;

(c) first electric means connected to at least one radiant heating element of said plurality of radiant heating elements, said at least one heating element being located centrally in said plurality of radiant heating elements for providing an independently controllable central zone of radiant heat energy output;

(d) second electric means interconnecting at least a first pair of radiant heating elements of said plurality of radiant heating elements, each radiant heating element of said first pair of radiant heating elements being disposed on a different opposite side of said one radiant heating element for providing a pair of intermediate zones of radiant heat energy output which are controllable as an entity; and (e) third electric means interconnecting at least a second pair of radiant heating elements of said plurality of radiant heating elements, each radiant heating element of said at least a second pair of radiant heating elements being disposed at different opposite ends of said plurality of radiant heating elements for providing a pair of end zones of radiant heat energy output which are controllable as an entity.

7. A heating apparatus as claimed in claim 6 wherein the central zone of radiant heat energy output is directed into said reaction chamber for heating a central zone extending coincidental with the gas flow path through said reaction chamber and across said fixed ring and across the central area of said susceptor.

8. A heating apparatus system as claimed in claim 6 wherein the intermediate zones of radiant heat energy output are directed into said reaction chamber for heating a pair of intermediate zones extending coincident with the gas flow path through said reaction chamber and across said fixed ring and across said susceptor along diametrically opposed sides.

9. A heating apparatus as claimed in claim 6 wherein the end zones of radiant heat energy output are directed into said reaction chamber for heating a pair of laterally disposed zones extending coincident with the gas flow path through said reaction chamber and across said fixed ring and across said susceptor adjacent the spaced apart sidewalls.

10. A heating apparatus as claimed in claim 6 comprising:

(a) each of at least a pair of concave reflector means being disposed above a different one of said second pair of radiant heating elements for reflecting some of the radiant heat energy output; and (b) a reflective planar surface disposed on the top wall above at least said one radiant heating element and above said first pair of radiant heating elements for reflecting radiant heat energy.

11. A heating apparatus as claimed in claim 1 wherein said lower heating element means includes a plurality of spacedly arranged elongated radiant heating elements.

12. A heating apparats as claimed in claim 11 wherein each of said plurality of elongated radiant heating elements is disposed on an axis transverse to the reactant gas flow path through said reaction chamber.

13. A heating apparatus as claimed in claim 1 wherein said lower heating element means includes a plurality of spaced apart elongated radiant heating elements disposed along axes transverse to the reactant gas flow path through said reaction chamber, means for electrically interconnecting said pluralilty of elongated radiant heating elements to provide at least three independently controllable banks of elongated radiant heating elements.

14. A heating apparatus as claimed in claim 13 comprising elongated concave reflector means associated with two of said banks of elongated radiant heating elements for reflecting radiant heat energy from each of said two banks of elongated radiant heating means into said reaction chamber.

15. A heating apparatus as claimed in claim 1 wherein said lower heating element means comprises:
   (a) a housing having a bottom wall and defining an upwardly opening chamber, said housing including the opening;
   (b) a plurality of radiant heating elements mounted in spaced side by side positions in said housing;
   (c) first electric means interconnecting at least a first pair of radiant heating elements of said plurality of radiant heating elements, each radiant heating lamp of said first pair of radiant heating elements being disposed on a different opposite side of the opening to provide an independently controllable central zone of radiant heat energy output;
   (d) second electric means interconnecting at least a second pair of radiant heating elements of said plurality of radiant heating elements, each radiant heating element of said second pair of radiant heating elements being disposed on a different opposite side of said first pair of radiant heating elements for providing a pair of intermediate zones of radiant heat energy output which are controllable as an entity;
   (e) third electric means connected to at least one radiant heating element of said plurality of radiant heating elements, said one radiant heating element being located at one end of said plurality of heating elements for providing a controllable first end zone of radiant heat energy output; and
   (f) fourth electric means connected to at least an other radiant heating element of said plurality of radiant heating elements, said other radiant heating element being located at an other end of said plurality of radiant heating elements for providing a controllable second end zone of radiant heat energy output.

16. A heating system as claimed n claim 15 wherein the central zone of radiant heat energy output is directed into said reaction chamber for heating a central region extending transverse of the reactant gas flow path through said reaction chamber and extending across said fixed ring and across said susceptor along diametrically opposed sides.

17. A heating apparatus as claimed in claim 15 wherein the pair of intermediate zones of radiant heat energy output are directed into said reaction chamber for heating a pair of intermediate regions transverse to the reactant gas flow path through said reaction chamber and extending across said fixed ring and across said susceptor along diametrically opposed sides.

18. A heating apparatus as claimed in claim 15 wherein the first end zone of radiant heat energy output is directed into said reaction chamber for heating a first end region transverse with the reaction gas flow path through said reaction chamber and extending across the side of each of said fixed ring and said susceptor located upstream in the reactant gas flow path.

19. A heating apparatus as claimed in claim 18 and including a concave reflector means disposed proximate said one radiant heating element for reflecting said first end zone of radiant heat energy output into said reaction chamber to heat said first end region.

20. A heating apparatus as claimed in claim 15 wherein said second zone of radiant heat energy output is directed into said reaction chamber for heating a second end region transverse to the gas flow path through said reaction chamber and extending across the side of each of said fixed ring and said susceptor located downstream in the reactant gas flow path.

21. A heating apparatus system as claimed in claim 20 and including a concave reflector means disposed proximate said other heating element for reflecting said second zone of radiant heat energy output into said reaction chamber to heat said second end region.

22. A heating apparatus as claimed in claim 15 and including a reflective planar surface disposed on the bottom wall of said housing and below said first and second pairs of radiant heating elements for reflecting radiant heat energy.

23. A heating apparatus as claimed in claim 1 wherein said heat concentrator means comprises:
   (a) at least a pair of heat focusing devices disposed on diametrically opposed sides of the depending tubular shaft, each of said heat focusing devices including,
      I. a dish shaped reflector having a base, a reflector axis extending normally, said reflector having a concave reflective surface defining a focal point lying on the reflector axis,
      II. a radiant heating lamp having a filament,
      III. means for mounting said heating lamp to locate at least a portion of the filament at the focal point of said reflector, and
      IV. means for mounting said reflector to direct the reflector axis upwardly toward the center of said susceptor.

24. A heating apparatus as claimed in claim 23 wherein the filament is linear and lies along the reflector axis.

25. A heating apparatus as claimed in claim 24 wherein said mounting means is adjustable to move said heating lamp relative to said reflector along the reflector axis.

26. A heating apparatus as claimed in claim 23 wherein said mounting means is adjustable to move said reflector toward and away from said reaction chamber.

27. A heating apparatus as claimed in claim 1 comprising:
   (a) said lower heating element means including,
      I. an upwardly open housing having a bottom wall and defining the central opening,
      II. a plurality of elongated radiant heating elements mounted in side by side positions in said housing; and
   (b) said heat concentrator means including at least a pair of heat focusing devices disposed on the downwardly facing surface of the bottom wall of said housing and on diametrically opposed sides of the central opening, each of said heat focusing devices including,
      I. a body having a bore for defining an axis, said body being mounted on the downwardly facing surface of the bottom wall of said housing with the bore of said body opening into said housing through the central opening and with the axis of the bore extending upwardly toward the center of said susceptor, II. a dish shaped reflector disposed in the bore of said body and having an upwardly opening concave reflective surface defining a reflector axis extending upwardly from the said reflective surface coincident with the axis of the bore of said body, said reflective surface having a focal point lying on the reflector axis, III. a radiant heating element disposed in the bore of said body and lying along the reflector axis, said radiant heating element having a filament, at least a portion of said filament being at the focal point of said reflective surface.

28. A heating apparatus as claimed in claim 27 means for mounting said dish shaped reflector in the bore of said body, said mounting means being adjustable for selectively moving said reflector toward and away from the central opening of said housing.

29. A heating apparatus as claimed in claim 27 including means for mounting said radiant heating element in the bore of said body, said mounting means being adjustable for selectively moving said radiant heating element along the reflector axis.

30. A method for heating a substrate having a top surface, which substrate is disposed upon a susceptor having a top and bottom surface, which susceptor is within a reaction chamber having a flow of reactant gas and a carrier gas therethrough during a chemical vapor deposition process, said method comprising the steps of:

(a) radiating heat upon the top surface of the substrate and the susceptor from a first plurality of radiant heat energy sources having a first longitudinal axis, said step of radiating including the step of concentrating radiant energy at diametrically opposed generally peripheral areas of the substrate and the susceptor;

(b) radiating heat upon the bottom surface of the susceptor from a second plurality of radiant heat energy sources having a second longitudinal axis orthogonal to the first longitudinal axis, said step of radiating including the step of concentrating radiant energy at diametrically opposed generally peripheral areas of the susceptor;

(c) concentrating the impingement of radiant heat energy from a third source upon the generally central bottom surface of the susceptor;

(d) sensing the temperature at a plurality of zones within the reaction chamber and generating signals reflective of the temperatures sensed; and (e) varying the radiant heat energy emitted by the first plurality of sources, the second plurality of sources and the heat concentrator means in response to the signals generated in said generating step to establish and to maintain the substrate at a uniform predetermined temperature during processing of the substrate.

31. The method as set forth in claim 30 including the step of sensing the temperature of the susceptor at several locations.

32. The method as set forth in claim 30 including the step of directing the radiant heat energy of the first plurality of radiant heat sources toward the substrate and the susceptor.

33. The method as set forth in claim 30 including the step of directing the radiant heat energy of the second plurality of radiant heat sources toward the susceptor.

34. The method as set forth in claim 30 including the step of adjusting the concentration of the radiant heat energy impinging upon the susceptor and emitted from the concentrator means.

* * * * *